United States Patent [19]
Sarin et al.

[11] Patent Number: 5,674,572
[45] Date of Patent: Oct. 7, 1997

[54] ENHANCED ADHERENCE OF DIAMOND COATINGS EMPLOYING PRETREATMENT PROCESS

[75] Inventors: Vinod K. Sarin, Lexington; Robert Rozbicki, Boston, both of Mass.

[73] Assignee: Trustees of Boston University, Boston, Mass.

[21] Appl. No.: 411,570

[22] Filed: Mar. 28, 1995

Related U.S. Application Data

[63] Continuation-in-part of Ser. No. 64,556, May 21, 1993, Pat. No. 5,433,977.

[51] Int. Cl.$^6$ ............................................. B05D 1/08
[52] U.S. Cl. ........................ 427/450; 427/560; 427/122; 427/314
[58] Field of Search ........................ 427/450, 560, 427/314, 122; 423/446

[56] References Cited

U.S. PATENT DOCUMENTS

| | | |
|---|---|---|
| 3,317,354 | 5/1967 | Darrow et al. |
| 4,734,339 | 3/1988 | Schachner et al. ............. 428/701 |
| 4,767,608 | 8/1988 | Matsumoto et al. |
| 4,915,977 | 4/1990 | Okamoto et al. |
| 4,938,940 | 7/1990 | Hirose et al. |
| 5,075,096 | 12/1991 | Tanabe et al. |
| 5,110,405 | 5/1992 | Sawabe et al. |
| 5,135,730 | 8/1992 | Suzuki et al. |
| 5,135,807 | 8/1992 | Ito et al. |
| 5,433,977 | 7/1995 | Sarin et al. ............. 427/450 |

FOREIGN PATENT DOCUMENTS

| | | |
|---|---|---|
| 4-333577 | 11/1992 | Japan. |
| 2243150 | 10/1991 | United Kingdom. |

OTHER PUBLICATIONS

Lux, et al., "Low Pressure Synthesis of Superhard Coatings", *10942 Coating Technology ODS-Alloys Ultrapure Refractory Metals*, vol. 12., 1989, pp. 615–660.

Abstract of Japan, JP 61 104078, vol. 10, No. 287 (C–375), "Toshiba Tungaloy Co., Ltd.") 30 Sep. 1986.

Derwent Publications Ltd., Class E36, AN 91-128042, Section CH, Week 9118; JP.A.03 065596 "Showa Denko KK", Mar. 1991.

"Low Pressure, Metastable Growth of Diamond and Diamondlike Phases, John C. Angus et al., *Science (Articles)*", Aug. 19, 1988, pp. 913–919.

"The Synthesis of High Quality Diamond in Combustion Flame", Yoichi Hirose et al., *Proc. 1st Int. Symp. on Diamond and Diamond Like Films* (The Electrochemical Society, Inc., Pennington, NJ, 1989, pp. 80–02.

"Synthesis of Diamond Film by ARC Discharge Plasma CVD", Naoto Ohtake et al., *Electrical Chemical Society Journal*, vol. 12, 1989, pp. 93–105.

"The Growth Mechanism of Diamond Crystals in Acetylene Flames", Yasuji Matsu et al., *Japanese Journal of Applied Physics*, vol. 29, No. 8, Aug. 1990, pp. 1552–1560.

"Diamond and Non–Diamond Carbon Synthesis in an Oxygen–Acetylene Flame", L.M. Hanssen et al., *Thin Solid Films; Preparation and Characterization*, 196, (1991), pp. 271–281.

(List continued on next page.)

*Primary Examiner*—Roy V. King
*Attorney, Agent, or Firm*—Baker & Botts, L.L.P.

[57] ABSTRACT

This invention is directed to the creation of diamond coatings with enhanced adherence, nucleation density and uniformity on substrates. The method of this invention includes the formation of a carbide layer on a substrate surface prior to diamond coating deposition via a pretreatment stage using an unmodified oxy-acetylene combustion flame. The carbide layer may be formed at a temperature outside of the normal deposition temperature range and is treated as a separate step in the diamond growth process. The carbide layer serves to improve nucleation density, uniformity and adherence of the subsequent diamond coating. Many different types of substrates may benefit from the advantages of this invention.

13 Claims, 6 Drawing Sheets

OTHER PUBLICATIONS

"The Nucleation and Morphology of Diamond Crystals and Films Synthesized by the Combustion Flame Technique", K.V. Ravi et al., *J. Mater. Res.*, vol. 5, No. 11, Nov. 1990, pp. 2356–2366.

"Growth of Textured Diamond Films on Si(100) by $C_2H_2$/$O_2$ Flame Method", J. Hwang et al., *J. Mater. Res.*, vol. 5, No. 11, Nov. 1990, pp. 2334–2336.

"Diamond Synthesis in Oxygen-Acetylene Flames: Inhomogeneities and the Effects of Hydrogen Addition", D.B. Oakes et al., *J. Appl. Phys.*, 69 (4), Feb. 15, 1991, pp. 2602–2610.

"Towards a General Concept of Diamond Chemical Vapour Deposition", Peter K. Bachmann et al., *Diamond and Related Materials*, No. 1, (1991) pp. 1–12.

"Diamond and Related Materials", R. Messier, *International Journal on the Science and Technology of Diamond and Related Materials*, vol. 1, No. 1, Aug. 15, 1991.

"Growth and Characterization of Diamond Thin Films", Nemanich, *Annu. Rev. Mater. Sci.*, vol. 21, pp. 535–558, 1991.

"Industrial Uses of Diamond", Busch, *Indimant, Am Redder 1,2072 Bargteheide*, W. Germany, Chapter 19, pp. 595–618.

"Metastable Growth of Diamond and Diamond–Like Phases", Angus et al., *Annu. Rev. Mater. Sci.*, vol. 21, pp. 221–48, 1991.

"Non-abrasive Industrial Uses of Diamond", Caveney, *De Beers Industrial Diamond Division*, Johannesburg, South Africa, Chapter 20, pp. 619–653.

"Physics of Diamond Growth", Muncke, *Diamond Research Laboratory*, Johannesburg, South Africa, Chapter 15, pp. 473–499.

"Synthesis of Diamond Under Metastable Conditions", R. C. DeVries, *Ann. Rev. Mater. Sci.*, vol. 17, pp. 161–187, 1987.

"Technology of Diamond Growth", Wedlake, *Diamond Research Laboratory*, Johannesburg, South Africa, Chapter 16, pp. 501–535.

ENHANCED ADHERENCE OF DIAMOND COATINGS EMPLOYING PRETREATMENT PROCESS

This application is a continuation-in-part of application Ser. No. 08/064,556, filed May 21, 1993, now U.S. Pat. No. 5,433,977.

BACKGROUND OF THE INVENTION

1. Field of the Invention

This invention relates generally to methods for synthesis of diamond and diamond-containing coatings on substrates by chemical vapor deposition (CVD) and specifically to a pretreatment method which enhances nucleation on the substrate surface.

2. Description of the Background

Crystalline diamond is one of the most remarkable substances ever discovered. It has the highest atomic number density of any of the terrestrial materials and is harder than any other solid, strongly resistant to abrasive wear, chemical wear, thermal shock, and degradation. The diamond also has the lowest compressibility and the highest thermal conductivity, nearly four times that of copper. Classically, the term diamond is reserved for crystalline cubic carbon. The cubic structure or lattice of the carbon atoms of the diamond is derived from a visualization of the saturated six member ring structure in layers, stacked and residing in a (111) coordination. A lattice with hexagonal symmetry is referred to as Lonsdaleite. Both cubic and hexagonal carbon lattices are composed entirely of $sp^3$ tetrahedrally coordinated carbon. Compounds containing significant amounts of $sp^2$ trigonally coordinated carbon atoms are technically not diamond, but diamond-like phases. The term diamond as used herein will not carry this distinction, but is used to refer to both the true diamond and the diamond-like forms of carbon.

Diamonds have become indispensable in industrial applications and the present sources of natural diamond do not equal existing demands. These demands are currently being met with synthetic diamonds. In the early 1900's there were a number of fairly credible reports of the synthesis of diamonds. Today these reports are generally discounted as either fanciful or just plain wrong. It was not until 1955 that the methods used to produce synthetic diamonds were first published (H. Liander, ASEA J1.28:97-98, 1955; F. P. Bundy et al., Nature 176:51-55, 1955). These researchers used a carbon solvent/catalyst to break the so-called graphite-diamond equilibrium line, which separates the two major atomic forms of the carbon atom, and formed $sp^3$ hybridized diamond from $sp^2$ hybridized graphite. Their methods required sustained temperatures of greater than 1600 K. and sustained pressures of greater than 60 kbar (6.0 GPa). Although the synthetic diamonds created were crude compared to their natural counterparts, these researchers demonstrated that the process was possible and took the subject matter out of the sphere of alchemy and into the modern world and opened a whole new field of technology.

Presently, over 90% of the worldwide demand for industrial diamonds is met by synthetic diamonds. There is hardly a production facility in modern industry that does not directly or indirectly require the synthetic diamond. Some of its most common uses are as optical windows for infrared and visible transmissions, as wear resistant superhard cutting tools, as super-sharp edges in medical applications, as abrasive, grinding materials and all tribological applications, as sliding materials, and as thin coatings for high temperature, high power semiconductor devices. As might be expected, the number and variety of uses to which synthetic diamonds are being applied is increasing and the demand is growing exponentially.

The diamond is a crystal like any other and the basic principles of crystal growth apply to this synthesis. Growth is limited by the basic thermodynamic variables of temperature, pressure and composition. The method selected for diamond growth depends upon what type of diamond is desired. Although there are as many different crystal structures as can be imagined, there are two basic types of diamond crystals, perfect or nearly perfect (Saw diamond abrasive (SDA)) and imperfect (Resinoid diamond abrasive (RDA)). The conventional method of diamond synthesis uses a carbonaceous material, usually graphite, which is mixed and compacted with a suitable solvent such as nickel, cobalt, or iron. The mixture is compressed to over 60 kbars in a reaction vessel and heated to above the eutectic melting point of the solvent. When this point is reached, diamond crystals begin to grow and eventually precipitate from the solution. This is the so-called high-pressure, high-temperature (HPHT) method of diamond synthesis.

The actual molecular processes which provide diamond growth are largely unknown as are the identities of all of the molecular species involved, but a few observations can be made. There is a large activation energy barrier between the two phases of carbon, graphite and diamond. Because the molar entropy of graphite is greater than that of diamond, the thermodynamic instability of the diamond increases with increasing temperatures. Consequently, increasing temperatures require increasing pressure to bring graphite and diamond into equilibrium. In all synthetic methods, increased temperatures are required solely for kinetic purposes. In high pressure diamond synthesis, molten carbon must be produced to create the high diffusion rates necessary to achieve crystal growth.

The conventional HPHT method of diamond synthesis is slow, arduous, and very expensive, requiring a great deal of expertise and dedicated bulky machinery. Intensive efforts around the world have been aimed at developing cheaper and more useful forms of synthetic diamond and particularly diamond coatings. Diamond coatings impart all of the advantageous properties of diamonds such as increased abrasive and chemical wear resistance, thermal shock resistance, and resistance to degradation, to a substrate. The advantages are clearly enormous. The principal difficulties have been encountered in determining how best to attach and secure the coating to the substrate. Over the past twenty years, significant progress has been made in growing diamond coatings by chemical vapor deposition (CVD). This method overcomes the need for extremely high pressures and the associated bulk and expense of the apparatus required to achieve these pressures. Further, the scope of materials which can be coated with diamond has been greatly expanded. Potential substrate materials are no longer required to withstand the enormous temperatures and pressures of the HPHT process.

The basic CVD process involves the introduction of one or more gasses into a reaction vessel or chamber. To the chamber is added sufficient energy to excite the gasses and raise the energy level of the individual gas molecules. As the energy level rises, some of the molecules ionize. At the substrate surface, large numbers of free radicals form and there is a high degree of atomic mobility which is necessary to achieve diamond growth. As the energy level falls, precursor carbon molecules enter a metastable state forming a diamond-like lattice structure which deposits on the nearest surface. The metastable state refers to the stable formation of diamond structures within the graphite stabilization region of the carbon temperature/pressure stabilogram. The metastable phase depends on selected conditions including the types of gasses and deposition surfaces, the ratio of gasses in the mixture, the presence of contaminants or additives, and the temperatures of the substrate and of the reaction. It is believed that, at least in part, metastable phases form from high energy diamond precursor molecules which become quenched upon reacting with the substrate. Metastable phases form from precursor molecules with high chemical potential which accounts for the need for a hydrocarbon source. Some of the more useful hydrocarbon sources are acetylene, allylene, ethane, isobutane, isobutylene, pentane, trimethylene, isopentane, propylene, butane, methane, ethylene, and propane.

There are a number of different CVD techniques which are categorized by the particular methods in which the source gas is decomposed or, in other words, the hydrocarbon molecules are raised to a higher level. Although there are various combinations and modifications, the basic CVD techniques are, hot filament CVD, generally described in U.S. Pat. No. 4,938,940, microwave plasma CVD, generally described in U.S. Pat. No. 4,767,608, electric discharge plasma CVD, generally described in U.S. Pat. No. 5,110,405, and combustion flame CVD, generally described in U.S. Pat. No. 5,135,730. The disclosures of these U.S. patents are hereby specifically incorporated by reference.

In hot filament CVD, a mixture of hydrocarbon and hydrogen gasses are passed over a tungsten filament or foil in a reaction chamber. To the chamber is added a substrate such as graphite. The filament is energized and the gases ignited heating the substrate to between 600–1200 K. The gases typically used in the hot filament technique are methane (1% –5%) diluted in hydrogen. Reaction pressure is selected from the range of 60 to 760 Torr. The dissociation products a these temperatures and pressures consist mainly of the radical species C, $C_2$, CH, $CH_2$, $CH_3$, and atomic hydrogen, as well as unreacted gasses. Deposition rates, which are rather slow, may be related to the enhanced recombination rate of atomic hydrogen or other radicals. Filaments are placed within about one centimeter of the substrate surface to minimize thermalization and recombination between radicals.

Although one of the more well investigated methods, hot filament CVD does have drawbacks. Radiation heating of the substrate can produce excessive surface temperatures and more importantly, non-uniform surface temperatures. With excessive substrate temperatures, carbon radicals fail to form on the surface. With low surface temperatures, carbon fails to deposit on the substrate in any form. Consequently, with a non-uniform temperature distribution across the substrate surface, carbon deposition is uneven and the resulting coating quality is poor. Additionally, as with all methods which require an enclosed chamber, substrate size is limited to chamber size.

In microwave CVD, initial nucleation rates are high in comparison to filament-type CVD methods, which allow for lower substrate temperatures. As before, a reaction chamber is required and into the chamber is injected a mixture of hydrocarbon and hydrogen gasses. To these gasses is applied a microwave or other high-frequency discharge to raise the molecules to a higher energy state. In the resulting plasma are growth nuclei such as diamond or inorganic powders. As the energy level falls to achieve the metastable state, diamond crystals form on the particles. Using this method, substrate surface temperatures as low as 823 K. have been reported (A. Sarabe and T. Inuzuka, Appl. Phys. Lett. 46:146, 1985). This method is highly reproducible and most useful for the creation of single-crystal diamonds. However, there is little to no binding between individual diamond particles and as with most forms of CVD, substrate size is limited to chamber size.

Diamond growth has also been reported using DC discharge between and anode and a cathode. In this method, inorganic crystals are placed into a reaction chamber containing an anode, a cathode, and a reaction gas including at least one organic compound. A direct current discharge between the two electrodes produces a plasma heating the chamber to between 800° and 1100° C. The inorganic crystals which may be made from silicon carbide or boron nitride are vibrated and single crystal diamond is deposited on the particles. Although growth rates are high there are numerous drawbacks. First, the DC discharge produces a bombardment of ions, electrons, and neutral gas particles with large amounts of energy. In order to withstand this bombardment, the elements within the reaction chamber must be made of a refractory metal such as molybdenum. A filament is often required to start and/or maintain the DC discharge which must also be made of a chemically stable material such as tungsten. Both molybdenum and tungsten are quite expensive. Moreover, the entire reaction is performed in a vacuum at around $10^{-7}$ Torr which adds a level of complexity to every step of the entire process.

Each of these methods involves thermally controlled diamond synthesis wherein the temperature of the reaction is much higher than the temperature of the substrate. These higher reaction temperatures produce dissociation of the carbon source gas. However, the extent of dissociation and gas phase chemistry is unique, making the role of particular excited states in each method nearly impossible to assess. Substrate temperature, although lower than reaction temperature must still be sufficiently to allow for mobility of surface molecules, particularly hydrogen for the saturation of carbon atoms. Also, elaborate apparati made of expensive metals are typically required as is a reaction chamber to either maintain a vacuum, to provide a rarefied atmosphere of noble gasses, or to totally eliminate certain compounds from the potential reactants. Moreover, these methods are more useful for the creation of single crystal diamond, not for the synthesis of diamond coatings. Adherence is not considered and intercrystal bonding does not take place to any significant degree.

In overcoming some of these problems, combustion flame CVD has proved to be a significant advancement. Using hydrocarbon gases in the open air, sufficiently high temperatures are achieved to ionize precursor carbon molecules which fall into the metastable state as the energy dissipates to form diamond coatings on most any substrate. Combustion flame CVD starts from nearly equimolar mixtures of oxygen and usually acetylene although other hydrocarbon gasses have been tested. Oxygen is added directly or as an integral part of the hydrocarbon gas. Hydrogen gas prevents surface reconstruction and suppresses the formation of unsaturated carbon nuclei. Combustion temperatures of about 2500° to about 3000° C. have been achieved. Carbon is partially dissociated from the source gas at higher temperatures, but total ionization is not believed to be critical to the process. In the presence of atomic hydrogen, the diamond surfaces are likely to be saturated with hydrogen because H—H bond energy is greater than C–H bond energy. Also, atomic hydrogen suppresses the formation of graphitic nuclei. The energy for these exothermic reactions is supplied by the energy added to dissociate hydrogen ($H_2 \rightarrow 2H$). Because of the dynamic interaction between atomic hydrogen and the diamond surface, there is a steady state concentration of free surface sites which is continually being replenished by carbon from the source gases.

In general, cutting or welding torches have been useful in combustion flame synthesis. Gas flow is maintained to create a flame from a single outlet port. Flame size is adjusted by altering the flow of gasses to create a feather in the flame which is the area of incomplete combustion and the zone where diamond deposition occurs. Into this feather region is placed the substrate to be coated. The substrate temperature is maintained at a constant by altering its exact position in the flame and by forcing a cooling fluid past the opposite end of the substrate, which may be integral to the substrate support structure. Substrate surface temperature during deposition must be maintained between 300°–1200° C. and is preferably between 800°–900° C.

The diamond deposition is generally annularly shaped or ball like when using a single nozzle oxy-acetylene torch. In contrast, use of a moving multitorch system permits a large area to be coated. At high carbon to oxygen ratios deposits with high amounts of amorphous carbon are found. At low carbon to oxygen ratios there is no carbon deposited due to complete oxidation of the components. When the carbon to oxygen ratio is set to about one, diamond coatings are observed over the entire deposition center. However, over this area, deposition is not uniform. At the edges, the density is non-uniform, decreasing at increasing distances from the deposition center. Generally the diamond crystals are well formed cubo-octahedrons of a high density and relatively free of pin holes. Consequently, although diamond coatings formed by combustion flame CVD are of a fairly high and consistent quality, strengths are low and non-uniformity may occur.

As described above, the combustion flame method has many desirable qualities such as inexpensive set up (it requires no reaction chamber), high growth rates (>1µ/minute) and selective deposition areas. Unfortunately, this method results in relatively poor adhesion, nonuniformity and a low nucleation density when deposition is performed on "as is" (i.e: non-abraded) substrates when compared to some of the previously mentioned CVD processes. In the case of silicon nitride substrates, a prime contributor to the problem of low nucleation density when depositing coatings is the low surface energy of the substrate material. An additional difficulty results from the presence of a silicon dioxide ($SiO_2$) layer which is formed during the processing of silicon nitride ($Si_3N_4$). In fact, it has been reported previously that when depositing diamond on silicon substrates using an oxyacetylene flame, the presence of $SiO_2$ completely inhibits the nucleation of diamond coatings. (See "Improved Uniformity and Selected Area Deposition of Diamond by the Oxy-Acetylene Flame Method", J. A. von Windheim and J. T. Glass, *Journal of Materials Research*, Vol. 7, No. 8, August 1992.)

Researchers have sought and developed various methods to combat low nucleation density. For example, nucleation is commonly enhanced by abrading the substrate surface with diamond powders or pastes, alumina ($Al_2O_3$), silicon carbide (SIC), or cubic boron nitride (c-BN). The scratches induced by the abrading function as nucleation sites, possibly due to the high concentration of dangling bonds. In addition, the submicron residue or "seeds" of the abrasive which remain after abrasion may also act to provide enhanced nucleation.

The effectiveness of the abrading method varies for different substrates such as tungsten, silicon, molybdenum and titanium. Unfortunately, however, the abrasive method described above is especially ineffective when using a silicon nitride substrate because abrading the surface does not remove the silicon dioxide surface which exists throughout the material. Additionally, any nucleation that may occur on the seeds will have poor adhesion to the substrate since the seeds are not chemically bonded to the surface.

A second method that has been suggested in deposition on "as is" substrates is surface pretreatment with a low temperature, low $R_f$ (0.75–0.80) flame which enhances nucleation by depositing an amorphous carbon layer on the substrate surface, followed by a higher temperature, higher $R_f$ (0.9–1.0) diamond deposition. It is believed that the amorphous carbon "seeds" enhance nucleation due to their high surface defect density, high concentration of dangling bonds, and a high solubility of atomic hydrogen (1–3%) all of which have been identified as a critical precursor to diamond growth. Although this method greatly enhances the nucleation of the diamond coatings, the adhesion of the coating is dependent upon the ability of the amorphous carbon layer to adhere to the substrate surface. Unfortunately, satisfactory adhesion of the carbon layer is typically not achievable.

SUMMARY OF THE INVENTION

The present invention overcomes the problems and disadvantages associated with current strategies and designs and provides new methods for synthesizing diamond coatings on a substrate using chemical vapor deposition (CVD).

The invention is directed a method for depositing a diamond coating by pretreating the substrate surface using a high temperature carburizing flame to form an SiC layer that subsequently nucleates a continuous, uniform and adherent diamond coating without the need for seeding. In this embodiment, a flame assisted pretreatment step is employed to enhance diamond coating nucleation on a substrate such as silicon nitride by convening the diamond growth inhibiting surface of various substrates to a diamond nucleating surface via the formation of a carbide layer.

Other embodiments and advantages of the invention are set forth in part in the following description, and in part, will be obvious from this description, or may be learned from the practice of the invention.

DESCRIPTION OF THE INVENTION

Figure 1:
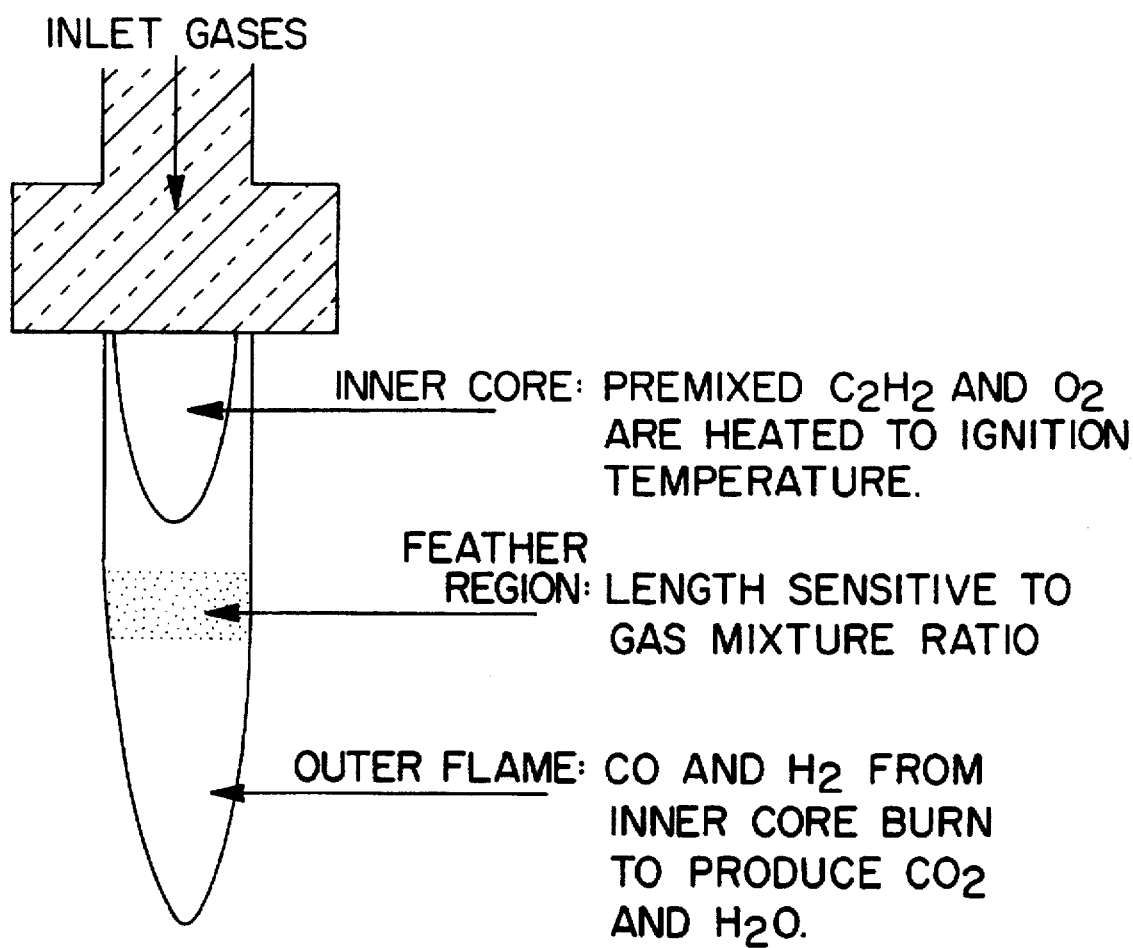
FIG. 1. Schematic depicting the three regions observed in an oxygen/acetylene flame, operated in a slightly $C_2H_2$ rich mode.

Diamond is one of the premier materials used for tribological applications. In most applications, especially tribologicial, good adherence of the coating to the substrate is one of the most critical requirements. For example, in cutting tools excellent adherence of diamond coatings to substrates is absolutely required. While many conventional diamond synthesizing processes are useful, their commercial viability is some what restricted due to cost. It is therefore considered extremely desirable if an inexpensive technique, such as the flame CVD process, could be successfully developed to yield high-quality adherent coatings.

The present invention, as embodied and broadly described herein, comprises methods of the synthesis of diamond coatings on substrates by chemical vapor deposition (CVD) using a flame assisted pretreatment to form a carbide layer on which subsequent diamond deposition can occur. The invention is also directed to substrates coated by these methods.

CVD, and particularly flame CVD, is the cheapest and easiest process to commercialize among all known diamond growth techniques. For example, in combustion flame CVD, gases such as acetylene ($C_2H_2$), ethylene ($C_2H_4$), propane ($C_2H_8$), and the like, are combined with oxygen ($O_2$) at a nozzle and ignited to produce a flame. Within the flame extremely high temperatures (over 3000° C. for the oxygen/acetylene flame) can be attained. Growth rates of diamond coatings using an oxygen/acetylene mixture have been reported to be higher in comparison to other gases. Furthermore, the flame itself is used as the reaction chamber, making the process relatively inexpensive. Precise control over the starting reagents can be achieved, resulting in a higher quality product.

One embodiment of the invention is directed to a method for the synthesis of a diamond coating on a substrate having enhanced adherence to the substrate using combustion flame CVD. In combustion flame CVD, a flame is created from a hydrocarbon source, which may be a saturated hydrocarbon such as methane, ethane, propane, butane, or pentane, an unsaturated hydrocarbon such as ethene, propene, butene, pentene, ethyene, propene, butadiene, cyclopentene, methylene, ethylene, propylene, butylene, acetylene, or arylene, and unsubstituted compounds such as isobutane, isopentane, neopentane, isohexane, trimethylene, or an aromatic compound such as benzene, toluene, xylene, or cyclohexane. The flame may additionally require an oxygen source which is preferably oxygen gas or air, but may be an alternative form of oxygen which is integral to the hydrocarbon source. The flow of hydrocarbon, and, if necessary, oxygen, are each adjustable, combine and emerge at a single port where the sources are ignited forming a flame. The size and temperature of the flame are adjusted by increasing or decreasing the flow rates of the sources using, for example, mass flow controllers. Alternatively, the flame size could also be adjusted by changing the exit port such as by changing the size or the flow dynamics of the nozzle.

The combustion flame comprises three regions, the outer flame region, the feather region and the inner core region. The temperature of the flame at the point of diamond deposition is very high. In the oxygen/acetylene flame this temperature is generally in the range of about 3000° C., to about 3500° C., preferably in excess of 3200° C. The inner core is the area of complete combustion where the hydrocarbon and, if necessary, the oxygen gasses are heated to ignition temperatures. The feather region, which appears when excess hydrocarbon is applied to the flame, is the area of incomplete combustion and the area in which diamond formation takes place. The length of the feather region is sensitive to the gas mixture ratio ($R_f$), as is the volume of the feather region which is controlled by adjusting the amount of oxygen added to the flame. The outer core is where carbon monoxide (CO) and the product in the inner core are converted into water ($H_2O$) and carbon dioxide ($CO_2$).

The flame can be created in nearly any atmosphere including argon or other noble gasses, such, as neon, krypton, xenon, or radon, or in the open air by adjusting the amount of oxygen supplied to the flame. Deposition zones are generally circular with sizes that can be varied by varying the size of the feather region of the flame by, for example, altering the flow and/or absolute amount of the hydrocarbon or altering the size of the output nozzle. Deposition zone size can be varied using different nozzle designs or multiple moving nozzles to provide greater coverage over a substrate. In the preferred embodiment the flame is an oxygen/acetylene torch. Flow rates of oxygen and acetylene, which are generally between about one to about two standard liters per minute (SLM), depend on the size of the desired flame and the volume ratio of oxygen to acetylene ($R_f = O_2/C_2H_2$), which is preferably less than about 1.0. The useful range for diamond growth is dependent upon such parameters as ambient room conditions including temperature, pressure, and humidity. For example, as air temperature or humidity increase, the amount of oxygen in the air decreases and more oxygen would have to be supplied to create the same flame. In a similar manner, at increased pressure, there is an increased amount of oxygen and a correspondingly lesser amount of oxygen would be needed by the flame. Deposition preferably occurs at greater than about 30 µm per hour. Coating thickness is variable and typically depends upon the use to which the coated article is to be applied. For cutting tools thickness is generally between about 5 µm to about 20 µm.

The temperature of the substrate is maintained by a controlling apparatus which circulates a cooling fluid which may be a gas or a liquid such as water. Preferably the cooling apparatus is a water cooled copper block. Substrate temperature is also adjusted by changing the distance between the substrate to the cooling apparatus. Substrate temperature is measured by a temperature sensing device such as infrared pyrometer or a chrome-alumel thermocouple which may be directly attached to the substrate. Additionally, depending on the temperature of the substrate, considerable flexibility in terms of controlling the grain size and crystal morphology of the coatings is available. This allows for the tailoring of coating properties and procedures to fit particular uses.

In most uses of coated substrates, including tribological, surface properties of the coating govern the performance of the article. One consideration is that there be adequate adhesion for the particular use to which the article is to be applied. Adhesion is a macroscopic property that depends on the chemical and mechanical bonding across the interfacial region, the intrinsic stress and stress gradient, and the stress to failure or the failure mode. Coating adhesion is measured by an adhesion test such as a peel test, a pull test, scratch test, a micro-scratch test, or a load or indentation test. One of the more reliable tests is the scratch test, first described by P. Benjamin and C. Weaver (Proc. R. Soc. A 254:163, 1960)

and later by P. J Burnett and D. S. Rickerby (Thin Solid Films 154:415, 1987), which are both hereby specifically incorporated by reference. In the scratch test, progressively increasing loads are applied to an indentor placed on the coated substrate. Optimization of indenter shape, size, geometry, and loading configurations can be developed through the boundary integral method, the empirical simulation model, or another method which is known to those of ordinary skill in the art. Loads are detected by, for example, an acoustic emission detector to determine critical load ($L_c$) to failure which is typically ensured in Newtons (N).

After the diamond coating has been deposited on the substrate, the crystals or the entire coating may be subjected to further manipulation. For example, CVD diamond crystals can be shaped by etching with molten rare-earth metals such as, for example, cerium (Ce) or lanthanum (La), as described by S. Jin et al. (Nature 362:822-24, 1993), which is hereby specifically incorporated by reference. Other methods of diamond etching include wet etching using chemicals such as aqua regia and the like. Alternatively, diamond coatings may be polished, thinned, or shaped as desired in the final product. These processes may be performed simultaneously or sequentially with the method of the invention.

The current invention employs a high temperature pretreatment step prior to the actual deposition of the diamond coating. The specific pretreatment step is most beneficial with a silicon nitride substrate although particular advantages may be gained by employing the step with other substrates as will be discussed below. In the preferred embodiment, an oxy-acetylene combustion flame method is used to deposit polycrystalline diamond coatings on an AY6 silicon nitride ($Si_3N_4$, 6% $Y_2O_3$, 2% $Al_2O_3$) substrate. It is to be understood that other deposition alternatives may be used in combination with the pretreatment step. For purposes of discussion only, an oxy-acetylene flame ($O_2$99.994% purity, $C_2H_2$99.6% purity) is used both to pretreat and to deposit on a silicon nitride substrate.

The volumetric flow rate of each of the gases is controlled by a MKS mass flow controller calibrated for nitrogen, but corrected for its respective gas. The total flow rate of both gases combined is approximately 4000 sccm, with the ratio of oxygen to acetylene flow ($R_f$) being the critical factor. A standard welding torch is used with a nozzle orifice of 0.89 mm and the substrate temperature is maintained by placement in a water cooled copper holder. Substrate temperature may be measured, for example, using an infrared pyrometer (Mikron—M90D) with a spectral response of 3.86μ and which is unaffected by the flame emissions. The flame is operated in the fuel rich mode ($R_f$<1.0) to produce the three distinct regions as illustrated in FIG. 1.

It has been determined that when diamond coatings are deposited on silicon substrates, a silicon carbide (SiC) layer is formed prior to the detection of diamond nucleation. This is due to the incoming carbon atoms diffusing into the surface and reacting with the silicon to form SiC. This interlayer of silicon carbide acts not only as the sight of the initial diamond nuclei, but it also minimizes the lattice mismatch of the diamond coating and the silicon substrate. Since silicon substrates are generally highly reactive and the diffusion of carbon into silicon at diamond growth temperatures is high, the SiC layer forms easily upon standard deposition parameters.

Unfortunately, this is not the case for silicon nitride and other "as is" substrates, which maintain their stability well throughout standard deposition temperatures and carbon atmospheres. An additional factor that impedes diamond nucleation on $Si_3N_4$ and other silicon based substrates is the presence of a glassy binder phase. This typically consists of alumina ($Al_2O_3$) and/or yttrium oxide ($Yt_2O_3$), but also silica ($SiO_2$) which is an unavoidable product of the sintering process used to manufacture silicon nitride substrates. As described above, the $SiO_2$ layer has been shown to completely inhibit diamond nucleation and it is very probable that the other oxides present have the same detrimental effect on diamond nucleation.

The pretreatment step of this invention remedies these problems by decomposing the silicon nitride and/or silica layers of the substrate surface to form a thin layer of silicon carbide (SiC), on which subsequent deposition at regular temperatures can occur. An important aspect of this pretreatment step is that it is performed well outside of the temperature range typically used for coating deposition making it a completely separate step in the overall process.

Figure 2A:
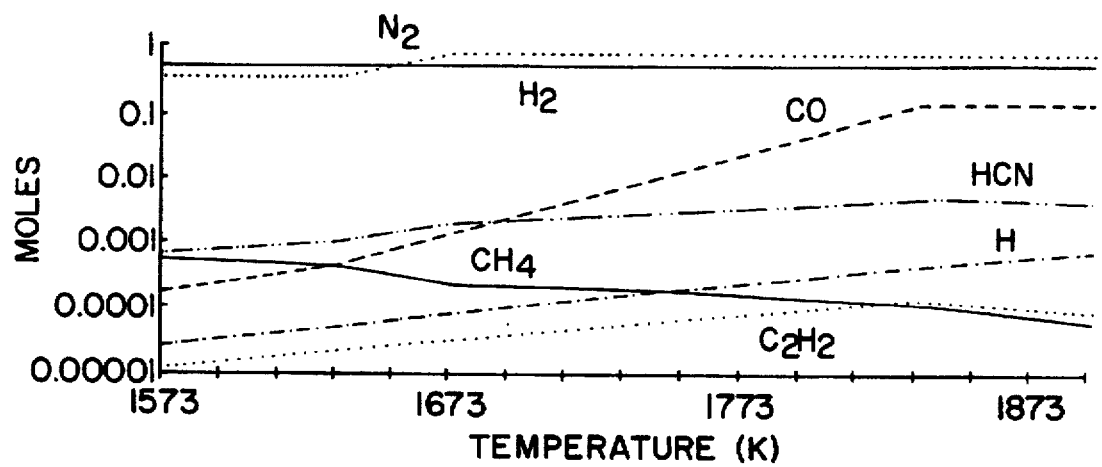
FIG. 2. (a) Thermodynamic model for gaseous species in silicon nitride (AY6) decomposition, and (b) Thermodynamic model for invariant solids in silicon nitride (AY6) decomposition.
Figure 2B:
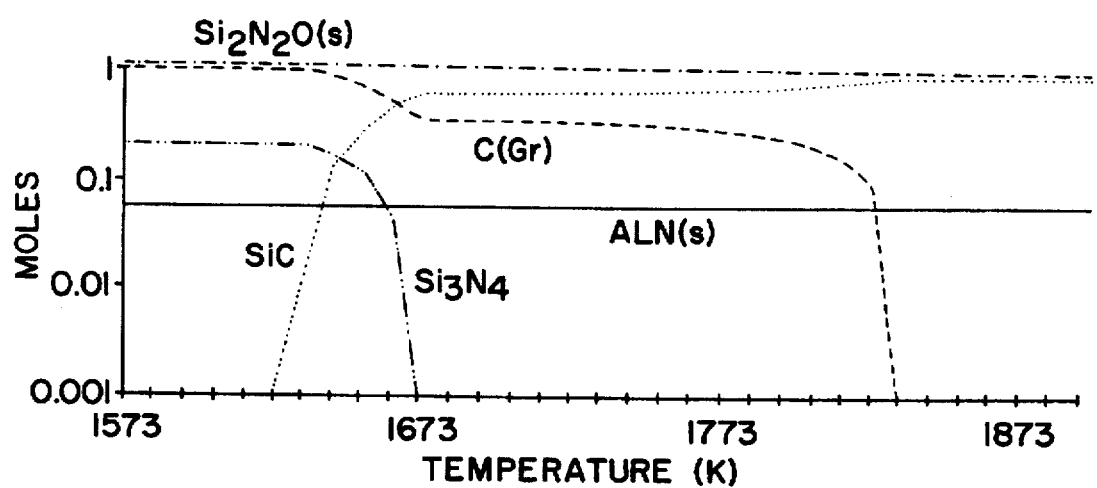

Thermodynamic modeling respecting the decomposition process was performed in order to determine the temperature at which the SiC interlayer could be formed. The modeling methodology minimizes the Gibb's free energy of a system at a given temperature and pressure in order to determine the concentrations of possible species at equilibrium. Calculations (at atmospheric pressure) were based upon one mol of reactant gasses (total) and one mol of substrate. As indicated in FIG. 2, for the temperature range of 1573 K. (1300° C.) to 1873 K. (1600° C.), $Si_3N_4$ is stable up to a temperature of about 1 623 K. at which point it decomposes and reacts with an invariant carbon species to form SiC, which appears at approximately 1623 K. FIGS. 2(a) and 2(b) show the quantities of the gaseous species and the invariant solids, respectively, over the indicated temperature range.

It should be noted that the trend in the invariant carbon species consumption along with the corresponding increase in $N_2$ (see FIG. 2(a)) would favor the following reaction:

$$Si_3N_4+3C(Gr)\Longrightarrow3SiC+2N_2 \text{(at } T=1623 \text{ K.)}$$

Figure 3A:
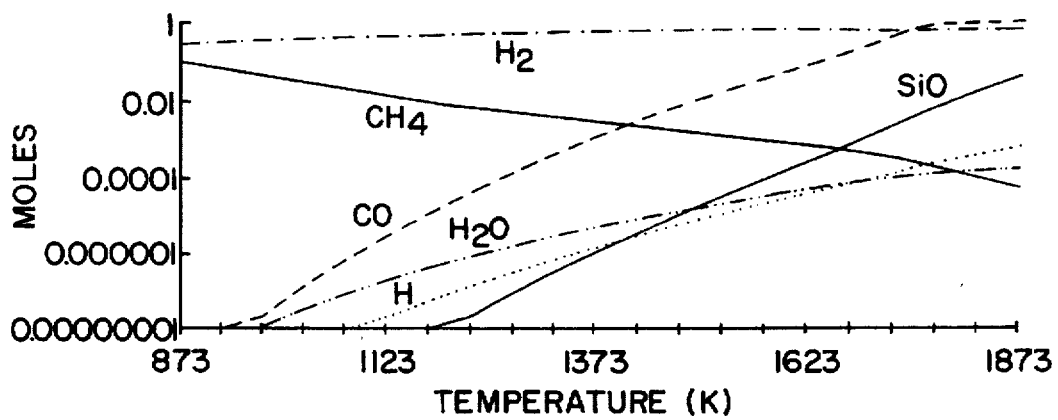
FIG. 3. (a) Thermodynamic model for gaseous species in $SiO_2$ decomposition, and (b) Thermodynamic model for invariant solids in $SiO_2$ decomposition.
Figure 3B:
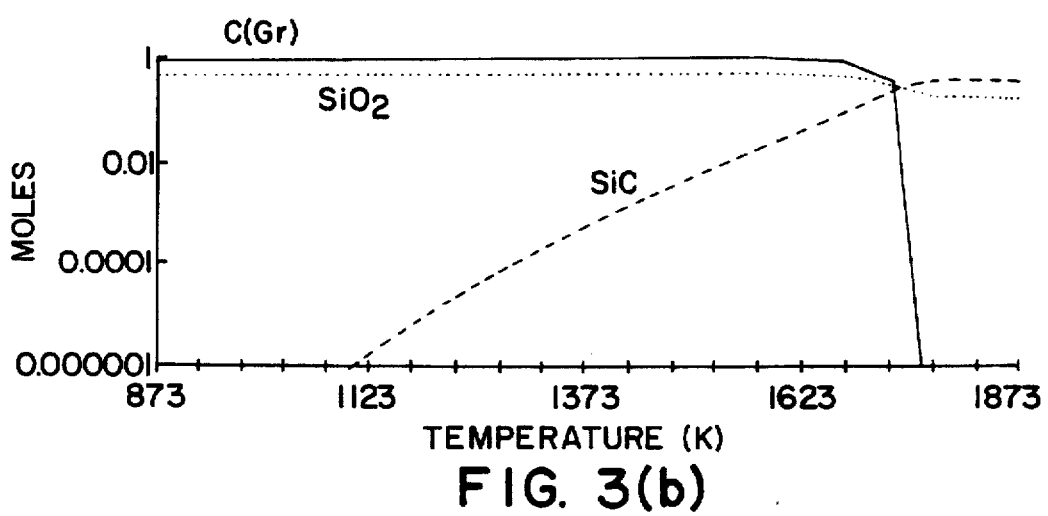

FIGS. 3(a) and 3(b) show the formation of an SiC layer during the pretreatment process of the AY6 substrate at temperature ranges from 873 K. (600° C.) to 1873 K. (1600° C). FIGS. 3(a) and 3(b) illustrate the thermodynamic analysis of the diamond inhibiting silica layer, which is unavoidably present due to reactions during the sintering of $Si_3N_4$ based substrates. More specifically, FIGS. 3(a) and 3(b) show that at a temperature of 1100 K., the formation of SiC begins as a result of the decomposition of $SiO_2$. It is predicted by this model that the formation of SiC starts at approximately 1100 K. (827° C.) and increases monotonically with temperature. The production of the SiC is primarily due to the decomposition of $SiO_2$ according to the theorized reaction:

$$SiO_2+3C(Gr)\Longrightarrow SiC+2CO \text{(at } T>1100 \text{ K.)}$$

The above reaction correlates well with the gaseous species trends observable in FIG. 3(a). The increase in SiC (due to the decomposition of $SiO_2$) is supported by an identical trend in the gaseous amount of CO until the "equilibrium" concentrations of SiC and $SiO_2$ is reached (at T~1750 K.), which is characterized by the complete consumption of C(Gr) to form SiC. At this point, the production of SiC as well as the decomposition of $SiO_2$ level off, as does the trend in CO production (see FIG. 3(a)).

The stability of silicon oxynitride ($Si_2N_2O$) as shown in FIG. 2(a) is difficult to overlook. It should be noted that its concentration over the whole of the evaluated temperature range is invariant. The role of silicon oxynitride in the nucleation of diamond coatings is believed to be unknown. Silicon oxynitride, which is the basis for SiALON-type compounds (containing silicon aluminum, oxygen and nitrogen is, however, believed to improve the adherence between other types of coatings (ALN) and a substrate by a reduction in the thermal mismatch.

As was mentioned earlier, diamond nucleation occurs on a carbide layer formed as carbon atoms diffuse into the surface and react. Also, nucleation of diamond is completely inhibited by a layer of $SiO_2$ resulting from the processing of the AY6 substrates. Thus, in order to enhance the nucleation rate on $Si_3N_4$, it is predicted that either:

1) At temperatures above 1623 K., $Si_3N_4$ decomposes, allowing the silicon to react with the invariant carbon to form SiC; or
2) At temperatures above 1100 K., SiC forms as $SiO_2$ decomposes and reacts with the invariant carbon, with the production of SiC increasing monotonically with temperature.

Whether the enhancement in nucleation on $Si_3N_4$ is due solely to one of the above predictions or a combination of them (since both $Si_3N_4$ and $SiO_2$ completely decompose at T>1750 K.), is unknown. Since the required temperature is well out of range of optimum diamond growing conditions, a short, high temperature pretreatment with a carburizing flame is required before actual deposition is initiated.

In a preferred embodiment, the substrate is polished with a 15µ diamond wheel followed by a 6µ diamond paste until a uniform surface is achieved on the substrate. The substrate is then ultrasonically cleaned for 15 minutes in acetone and wiped with ethanol to remove any residue. The substrate is then pretreated with the flame at the required temperature by reduction of cooling water flow through the copper substrate holder. The pretreatment process will typically last between 1 and 4 minutes although the time may fall outside this range. In a preferred embodiment, a pretreatment time of 3 minutes is employed. The substrate is preferably placed farther away from the inner cone during the pretreatment than during deposition in order to avoid the severe temperature gradients that may be associated with a situation in which the inner cone is too close to the substrate surface. In a preferred embodiment, the substrate is placed in the feather region at a distance equal to or greater than half of the inner cone length. Subsequent diamond coating deposition is then carried out at regular temperatures described above with the substrate positioned inside the feather a few millimeters below the inner cone.

Figure 4A:
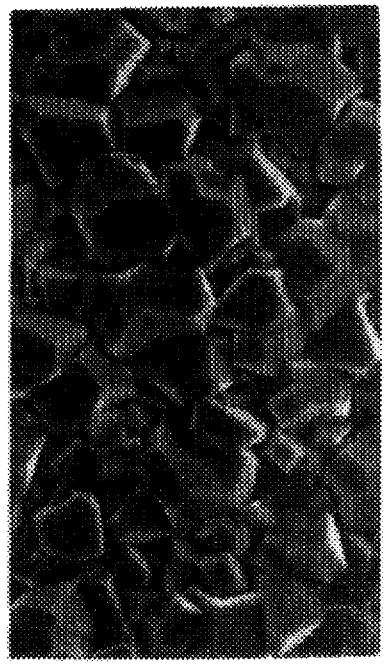
FIG. 4. (a) Photomicrograph of diamond coating grown at center of pretreated silicon nitride substrate (Magnification=1000×), and (b) Photomicrograph of diamond coating grown at edge of pretreated silicon nitride substrate (Magnification=1000×).
Figure 4B:
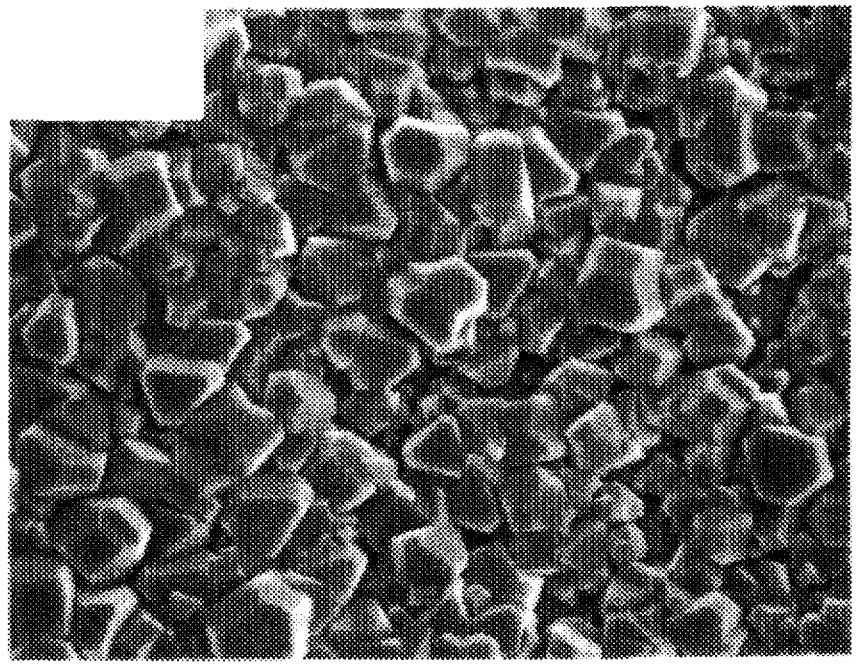

The flow ratio ($R_f$) for both pretreatment and deposition is preferably ~1.0. The coating illustrated in FIG. 4(a) (center) and 4(b) (edge) is grown at 780° C. for 20 minutes. As can be seen in FIG. 4, the coating which is grown possesses extremely high particle density at both the center and edge. Variations in morphology and size of the diamond crystals results from the radial temperature gradient that occurs as a combustion flame is positioned perpendicular to the surface. The center of the coating (FIG. 4(a)) has a cubo-octahedral (100)/(111) dominated morphology due to the fact that the highest substrate surface temperature occurs directly below the inner cone of the flame. Towards the outside of the deposit, an octahedral (111) morphology dominates since the substrate surface temperature is lower than that of the center region.

Figure 5A:
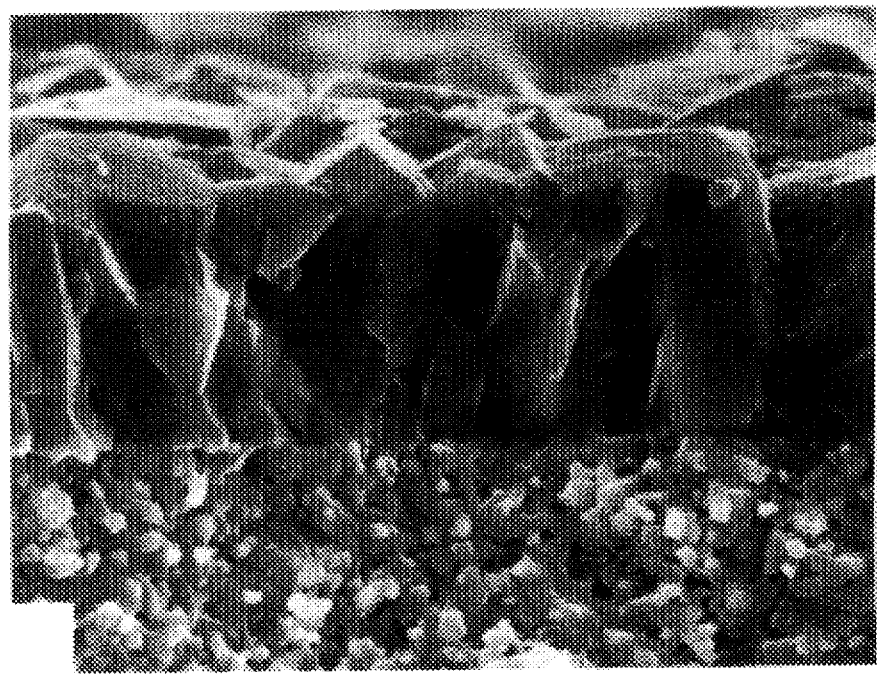
FIG. 5. (a) Photomicrograph showing cross-section of diamond coating illustrated in FIG. 4(a), (Magnification=3500×), and (b) Photomicrograph showing cross-section of diamond coating illustrated in FIG. 4(b), (Magnification=3500×).
Figure 5B:
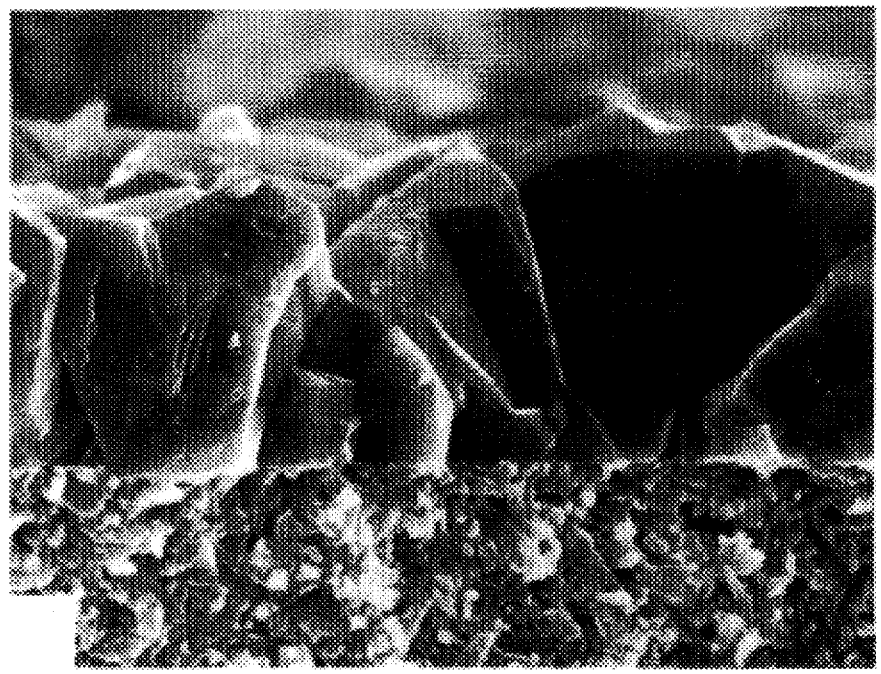

FIG. 5 is a cross-sectional view at the center (FIG. 5(a)) and at the outside (FIG. 5(b)) of the deposit shown in FIG. 4. This view was obtained by fracturing the substrate along the center of the deposited coating. FIG. 5 illustrates that the coating has a uniform thickness of approximately 10 µm. It should be noted that when fracturing the substrates to obtain the cross-sectional view, none of the areas of the coating were flaked off. This can be seen in FIGS. 5(a) and 5(b) as the diamond coating is in close contact with the $Si_3N_4$ substrate surface. Further, no voids exist between the substrate and the deposited coating. These facts qualitatively suggest that the deposited coating has excellent adhesion to the substrate surface, which is of paramount importance in cutting tool applications.

The adhesion of the coating was quantitatively measured using a scratch test that continuously increases the load of a diamond tipped indentor and senses coating failure via an acoustic emissions detector. The indentor used for these tests was a Rockwell diamond tip with a 120° cone angle and a tip radius of 200 µm. The critical load at failure for the coating in FIGS. 4 and 5 was greater than 50N.

Figure 6A:
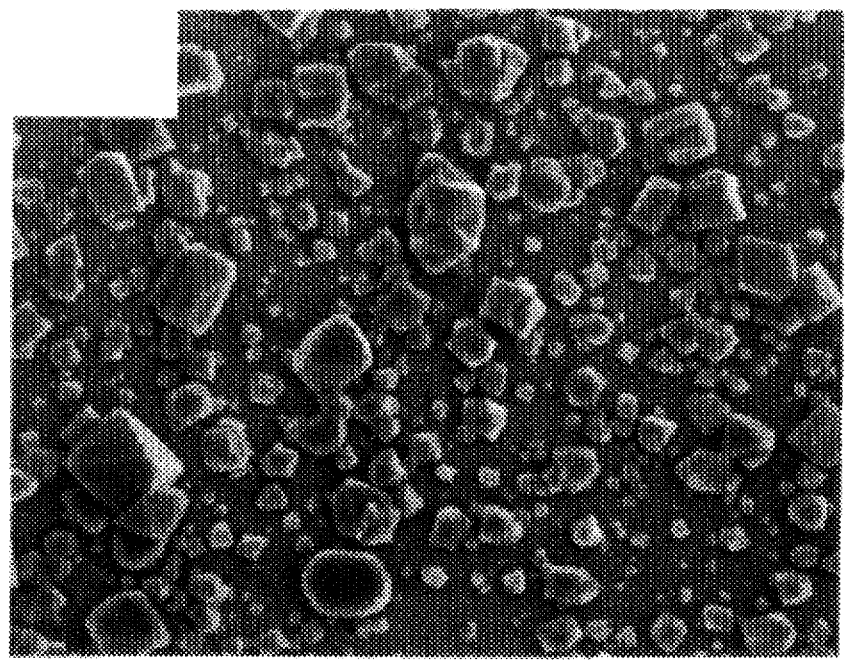
FIG. 6. (a) Photomicrograph showing diamond coating growth at center of unpretreated silicon nitride substrate, (Magnification=1000×), and (b) Photomicrograph of diamond coating growth at edge of unpretreated silicon nitride substrate, (Magnification=1000×).
Figure 6B:
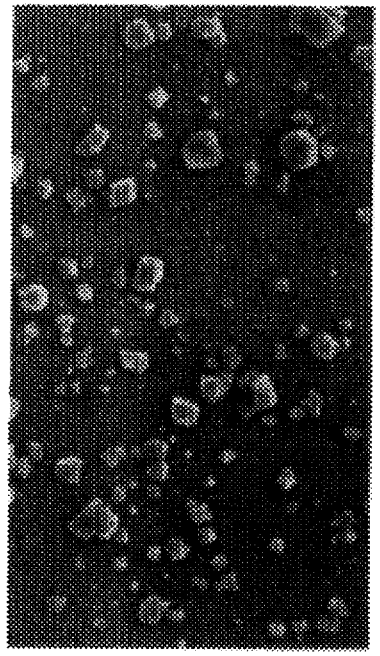

By way of comparison, a coating was grown on an identically prepared $Si_3N_4$ substrate under the exact same conditions save the pretreatment step. This coating is illustrated in FIG. 6 with FIG. 6(a) showing the center and FIG. 6(b) showing the outside. As can be seen in FIG. 6, the coating grown without the pretreatment step suffers from nonuniformity in crystal size. What is even more apparent, however, is the extremely low nucleation rate, which in this case was not even sufficient to grow a continuous coating. This low nucleation density may be attributed to either the stable silicon nitride surface at diamond deposition temperatures or to the presence of an $SiO_2$ layer which has been shown to inhibit diamond nucleation on silicon.

It would appear that the silicon dioxide layer would be removed when the substrate is polished with the 15 µm diamond wheel, but according to literature regarding the manufacture of AY6, an $SiO_2$ layer often surrounds each grain of silicon nitride as it is sintered. Thus, a polishing step is not expected to completely remove the $SiO_2$ present. In any case, any nucleation at all on the non-pretreated silicon nitride is believed to occur due to the residual diamond powder resulting from the preparation of the substrate.

In addition to the above described substrates, the present invention may also be of benefit for use with other substrates. Particular candidates are other nitrides such as titanium nitride (TiN) and boron nitride (BN) as well as oxides that, although typically inhibiting diamond nucleation, may be able to be decomposed at the high pretreatment temperature to form carbides.

Other embodiments or uses of the invention will be apparent to those skilled in the art from consideration of the specification and practice of the invention disclosed therein. It is intended that the specification and examples be considered exemplary only, with the true scope and spirit of the invention being indicated by the following claims.

We claim:

1. A method for producing a substrate coated with a layer of crystalline diamond particles comprising the steps of:
    a) pretreating said substrate to form a carbide layer on the substrate by placing said substrate in a first flame and maintaining said substrate temperature at between about 427 ° C. to about 1827 ° C.;
    b) positioning the substrate, which is maintained at a temperature of between about 300° C. to about 1200° C., in a second flame; and
    c) depositing an adherent, uniform layer of crystalline diamond particles of substantially uniform size and shape on said substrate.

2. The method of claim 1 wherein said second flame comprises an inner core region, a feather region and an outer region and wherein said substrate is positioned in said feather region of said second flame during said step of depositing said diamond particles.

3. The method of claim 2 wherein said second flame is created in a combustion device being supplied with a flow of oxygen and acetylene.

4. The method of claim 3 wherein said second flame also serves as said first flame.

5. The method of claim 3 wherein said first flame is created in a combustion device being supplied with a flow of oxygen and acetylene.

6. The method of claim 5 wherein said first flame and second flame are operated with a volumetric flow ratio $R_f$ less than or equal to about 1.0.

7. The method of claim 1 wherein said substrate comprises silicon nitride.

8. The method of claim 1 further comprising the step of polishing said substrate, said polishing step occurring prior to said pretreatment step.

9. The method of claim 8 wherein said polishing step comprises polishing the substrate with a 15μ diamond wheel followed by polishing said substrate with a 6μ diamond paste.

10. The method of claim 9 wherein following said polishing step, said substrate is ultrasonically cleaned with acetone and wiped with ethanol.

11. A method for producing a substrate coated with an adherent, uniform layer of crystalline diamond particles by combustion flame chemical vapor deposition comprising the steps of:

a) establishing a flow of oxygen and acetylene to a combustion device at a volumetric flow ratio ($R_f=O_2/C_2H_2$) of less than or equal to about 1.0;

b) creating a flame in the combustion device, wherein the flame comprising an inner core region, an acetylene feather region, and an outer region;

c) preheating the substrate to form a carbide layer on said substrate, which is maintained at a temperature of between 427° C. and 1827° C.; and placing said substrate in the acetylene feather region;

d) positioning the substrate, which is maintained at a temperature of between about 300° C. to about 1200° C., in the acetylene feather region;

e) depositing an adherent, uniform layer of crystalline diamond particles of substantially uniform size and shape on the substrate.

12. The method of claim 11 wherein the flame is created by an oxygen/acetylene torch.

13. The method of claim 11 wherein the substrate is maintained at a temperature of between about 700° C. to about 900° C. during the deposition step.

* * * * *